(12) United States Patent
Chou

(10) Patent No.: US 9,188,603 B2
(45) Date of Patent: Nov. 17, 2015

(54) ANTENNA TESTING DEVICE AND ANTENNA TESTING UNIT THEREOF

(71) Applicant: WISTRON CORP., New Taipei (TW)

(72) Inventor: Chen-Yu Chou, New Taipei (TW)

(73) Assignee: Wistron Corp., New Taipei (TW)

( * ) Notice: Subject to any disclaimer, the term of this patent is extended or adjusted under 35 U.S.C. 154(b) by 295 days.

(21) Appl. No.: 13/895,259

(22) Filed: May 15, 2013

(65) Prior Publication Data

US 2014/0043037 A1    Feb. 13, 2014

(30) Foreign Application Priority Data

Aug. 13, 2012    (TW) .............................. 101129144 A

(51) Int. Cl.
*G01R 29/10*    (2006.01)
*G01R 1/02*    (2006.01)

(52) U.S. Cl.
CPC . *G01R 1/02* (2013.01); *G01R 29/10* (2013.01)

(58) Field of Classification Search
CPC ........... G01R 29/10; G01R 1/02; H01Q 1/243
USPC .................... 343/702, 700 MS, 703; 324/537
See application file for complete search history.

(56) References Cited

U.S. PATENT DOCUMENTS

| 6,133,879 | A  | * | 10/2000 | Grangeat et al. ........ 343/700 MS |
| 8,059,046 | B2 | * | 11/2011 | Nysen ............................ 343/725 |
| 8,907,851 | B2 | * | 12/2014 | Kuo et al. ...................... 343/702 |
| 2010/0090912 | A1 | | 4/2010 | Lin et al. |
| 2013/0135159 | A1 | * | 5/2013 | Goebel et al. ................. 343/703 |

FOREIGN PATENT DOCUMENTS

TW    M362518 U1    8/2009

OTHER PUBLICATIONS

Taiwan Patent Office, Office Action, Patent Application Serial No. 101129144, Jun. 4, 2014, Taiwan.

* cited by examiner

*Primary Examiner* — Hoanganh Le

(57) ABSTRACT

An antenna testing unit is provided. The antenna testing unit includes a ground element and a radiator. The radiator includes a body, a first radiator unit and a second radiator unit. The body corresponds to the ground element. The first radiator unit is connected to the body, comprising a first wing shaped portion and a second wing shaped portion, wherein a shape of the first wing shaped portion is symmetrical to a shape of the second wing shaped portion. The second radiator unit is connected to the body, and comprises a first section and a second section, wherein the first section extends toward the first wing shaped portion, and the second section extends toward the second wing shaped portion.

10 Claims, 4 Drawing Sheets

ANTENNA TESTING DEVICE AND ANTENNA TESTING UNIT THEREOF

CROSS REFERENCE TO RELATED APPLICATIONS

This application claims priority of Taiwan Patent Application No. 101129144, filed on Aug. 13, 2012, the entirety of which is incorporated by reference herein.

BACKGROUND OF THE INVENTION

1. Field of the Invention

The present invention relates to an antenna testing device, and in particular, relates to an antenna testing device for performing a near field test on a portable electronic device.

2. Description of the Related Art

Conventionally, coupling antennas, horizontal antennas and directional antennas are utilized to perform antenna tests to an antenna of a portable electronic device. However, coupling antennas have compensation problems due to small antenna dimensions or a far testing distance. Similarly, horizontal antennas have unstable compensation problems due to the large radiation angle of the horizontal antenna. Directional antennas have radiation refraction problems due to the huge radiation intensity and small radiation angle of the directional antenna. Therefore, an improved antenna testing device is required.

BRIEF SUMMARY OF THE INVENTION

In an embodiment of the invention, an antenna testing device for testing a wireless transmission of an electronic device is provided. The antenna testing device includes a stage, an emitting unit, a compensating unit and a testing area. The emitting unit is formed on the stage, wherein a feed signal is fed to the emitting unit. The compensating unit is formed on the stage, wherein a radiation field is formed between the emitting unit and the compensating unit. The testing area is located between the emitting unit and the compensating unit, wherein the electronic device is placed on the testing area to be test.

In an embodiment of the invention, an antenna testing unit is provided to be utilized in the antenna testing device above. The antenna testing unit includes a ground element and a radiator. The radiator includes a body, a first radiator unit and a second radiator unit. The body corresponds to the ground element. The first radiator unit is connected to the body, and comprises a first wing shaped portion and a second wing shaped portion, wherein a shape of the first wing shaped portion is symmetrical to a shape of the second wing shaped portion. The second radiator unit is connected to the body, comprising a first section and a second section, wherein the first section extends toward the first wing shaped portion, and the second section extends toward the second wing shaped portion.

Utilizing the antenna testing device of the embodiment of the invention, the electronic device can be tested by a near field test with high, middle and low frequency testing signals. Additionally, with the symmetric compensating unit, the emitting unit can be coupled with the compensating unit to compensate for insufficient radiation space and to provide complete radiation.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
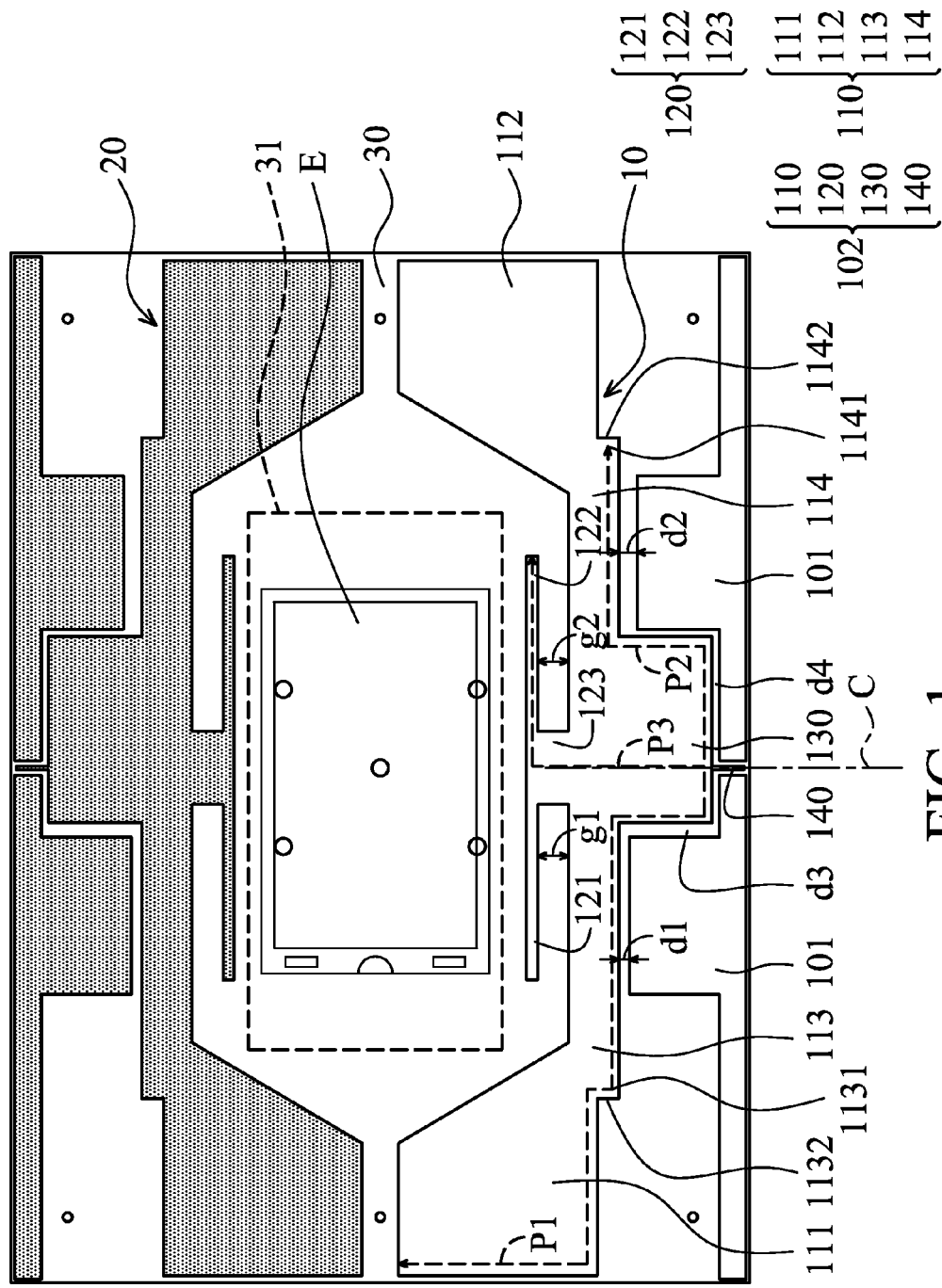
FIG. 1 shows the antenna testing device of the first embodiment of the invention.

FIG. 1 shows an antenna testing device 1 of a first embodiment of the invention for testing a wireless transmission of an electronic device E. The antenna testing device 1 comprises a stage 30, an emitting unit 10, a compensating unit 20 and a testing area 31. The emitting unit 10 is formed on the stage 30, wherein a feed signal is fed to the emitting unit 10. The compensating unit 20 is formed on the stage 30, wherein a radiation field is formed between the emitting unit 10 and the compensating unit 20. A testing area 31 is located between the emitting unit 10 and the compensating unit 20, wherein the electronic device E is placed on the testing area 31 to be tested. In this embodiment, a shaped of the emitting unit 10 is substantially symmetrical to a shaped of the compensating unit 20 relative to the testing area 31.

A detailed structure of an antenna testing unit (emitting unit 10 or compensating unit 20) is described next with the example of the emitting unit 10. The emitting unit 10 comprises a ground element 101 and a radiator 102. The radiator 102 comprises a body 130, a first radiator unit 110 and a second radiator unit 120. The first radiator unit 110 is connected to the body 130. The first radiator unit 110 comprises a first wing shaped portion 111 and a second wing shaped portion 112. A shape of the first wing shaped portion 111 is symmetrical to a shape of the second wing shaped portion 112. The second radiator unit 120 is connected to the body 130, the second radiator unit 120 comprises a first section 121 and a second section 122, wherein the first section 121 extends toward the first wing shaped portion 111, and the second section 122 extends toward the second wing shaped portion 112.

The second radiator 120 further comprises a connection section 123, wherein the connection section 123 is connected to the body 130, and the first section 121, the second section 122, and the connection section 123 compose a T-shaped structure.

The T-shaped structure is on a central line C, and the first wing portion 111 is symmetrical to the second wing portion 112 relative to the central line C.

The first radiator unit 110 further comprises a first extending portion 113 and a second extending portion 114, the first extending portion 113 is connected to the first wing shaped portion 111 and the body 130, and the second extending portion 114 is connected to the second wing shaped portion 112 and the body 130. The first section 121 is parallel to the first extending portion 113, and the second section 122 is parallel to the second extending portion 114. A first coupling gap g1 is formed between the first section 121 and the first extending portion 113. A second coupling gap g2 is formed between the second section 122 and the second extending portion 114. The first coupling gap g1 can be equal to or different from the second coupling gap g2. In this embodiment, the first coupling gap g1 and the second coupling gap g2 is between 7 mm-9 mm.

A first coupling distance d1 is formed between the first section 121 and the ground element 101. A second coupling distance d2 is formed between the second section 122 and the ground element 101. The first coupling distance d1 can be equal to or different from the second coupling distance d2. In this embodiment, the first coupling distance d1 and the second coupling distance d2 are between 2 mm~5 mm.

A coupling distance d3 and a coupling distance d4 can be further formed between the body 130 and the ground element 101, as shown in FIG. 1. The coupling distance d3 can be equal to or different from the coupling distance d4. In this embodiment, the coupling distance d3 and the coupling distance d4 can be between 2 mm~5 mm.

In the embodiment of FIG. 1, the first extending portion 113 comprises a first extending end 1131, and the first wing shaped portion 111 is connected to the first extending end 1131. A first bending edge 1132 is formed on a location where the first extending end 1131 is connected to the first wing shaped portion 111. The second extending portion 114 comprises a second extending end 1141, wherein the second wing shaped portion 112 is connected to the second extending end 1141, and a second bending edge 1142 is formed on a location where the second extending end 1141 is connected to the second wing shaped portion 112.

A feed portion 140 is formed on the body 130. As shown in FIG. 1, a path P1 is formed between the feed portion 140 and the end of the first wing shaped portion 111, or between the feed portion 140 and the end of the second wing shaped portion 112. The length of the path P1 is about half that of the wavelength of a high frequency signal (for example, 1.7 GHz~2.7 GHz). A path P2 is formed between the feed portion 140 and the first extending end 1131, or between the feed portion 140 and the second extending end 1141. The length of the path P2 is about a quarter of that of the wavelength of a middle frequency signal (for example, 1.4 GHz~1.6 GHz). A path P3 is formed between the feed portion 140 and the end of the first section 121 or between the feed portion 140 and the end of the second section 122. The length of the path P3 is about a quarter of that of the wavelength of a low frequency signal (for example, 700 MHz~960 MGHz). Therefore, high, middle and low frequency testing signals are provided.

Utilizing the antenna testing device of the embodiment of the invention, the electronic device can be tested by a near field test with high, middle and low frequency testing signals. Additionally, with the symmetric compensating unit, the emitting unit can be coupled with the compensating unit to compensate for insufficient radiation space and to provide complete radiation.

Figure 2:
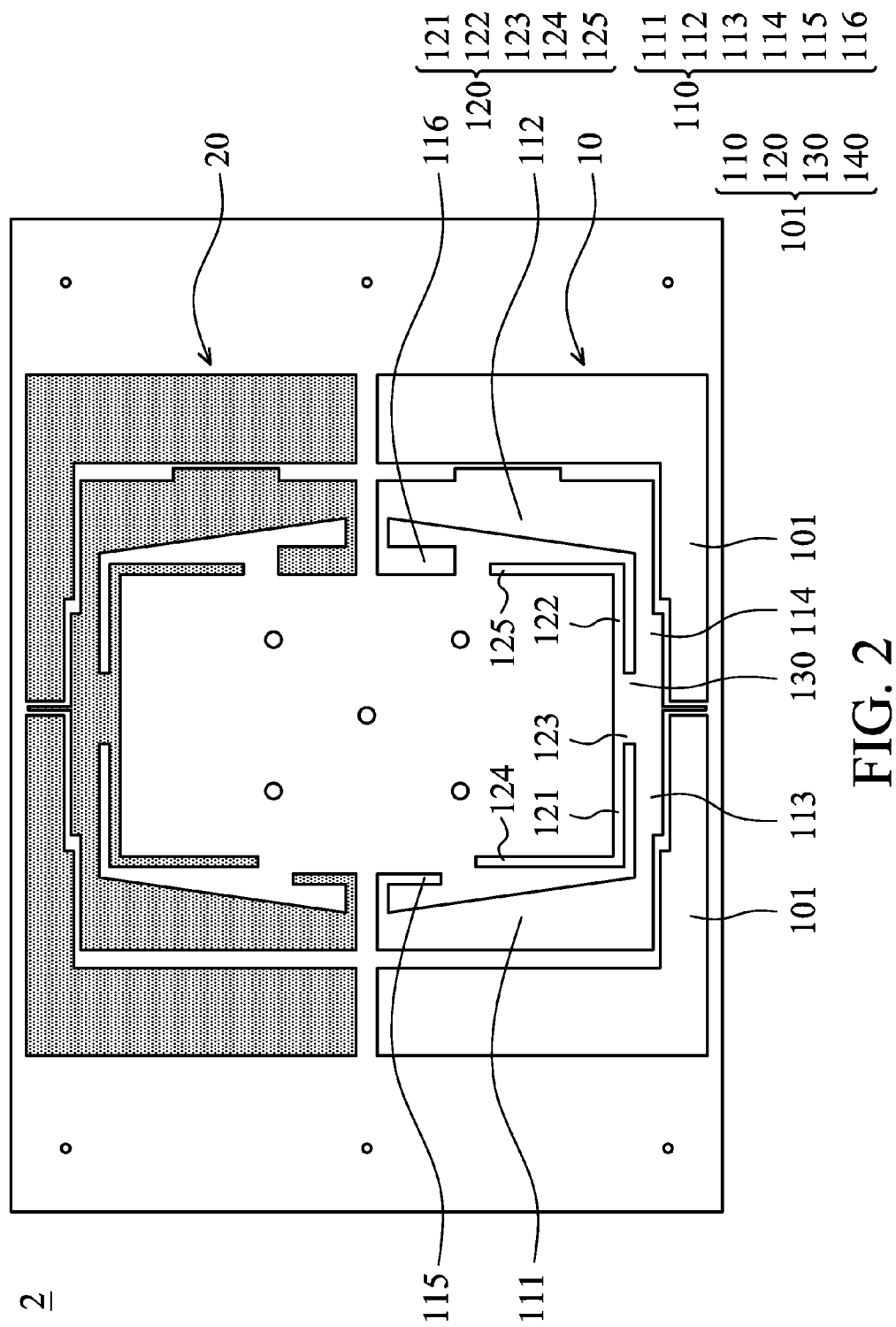
FIG. 2 shows the antenna testing device of the second embodiment of the invention.

FIG. 2 shows an antenna testing device 2 of a second embodiment of the invention. Compared to the first embodiment, the second embodiment is characteristic in that the second radiator unit 120 further comprises a first extending section 124 and a second extending section 125, wherein the first extending section 124 is connected to and perpendicular to the first section 121, and the second extending section 125 is connected to and perpendicular to the second section 122. The first radiator unit 110 comprises a first bending portion 115 and a second bending portion 116, wherein the first bending portion 115 is connected to the first wing shaped portion 111, and the second bending portion 116 is connected to the second wing shaped portion 112. With the design of the first extending section 124, the second extending section 125, the first bending portion 115 and the second bending portion 116, the dimensions of the antenna testing unit can be further reduced.

Figure 3:
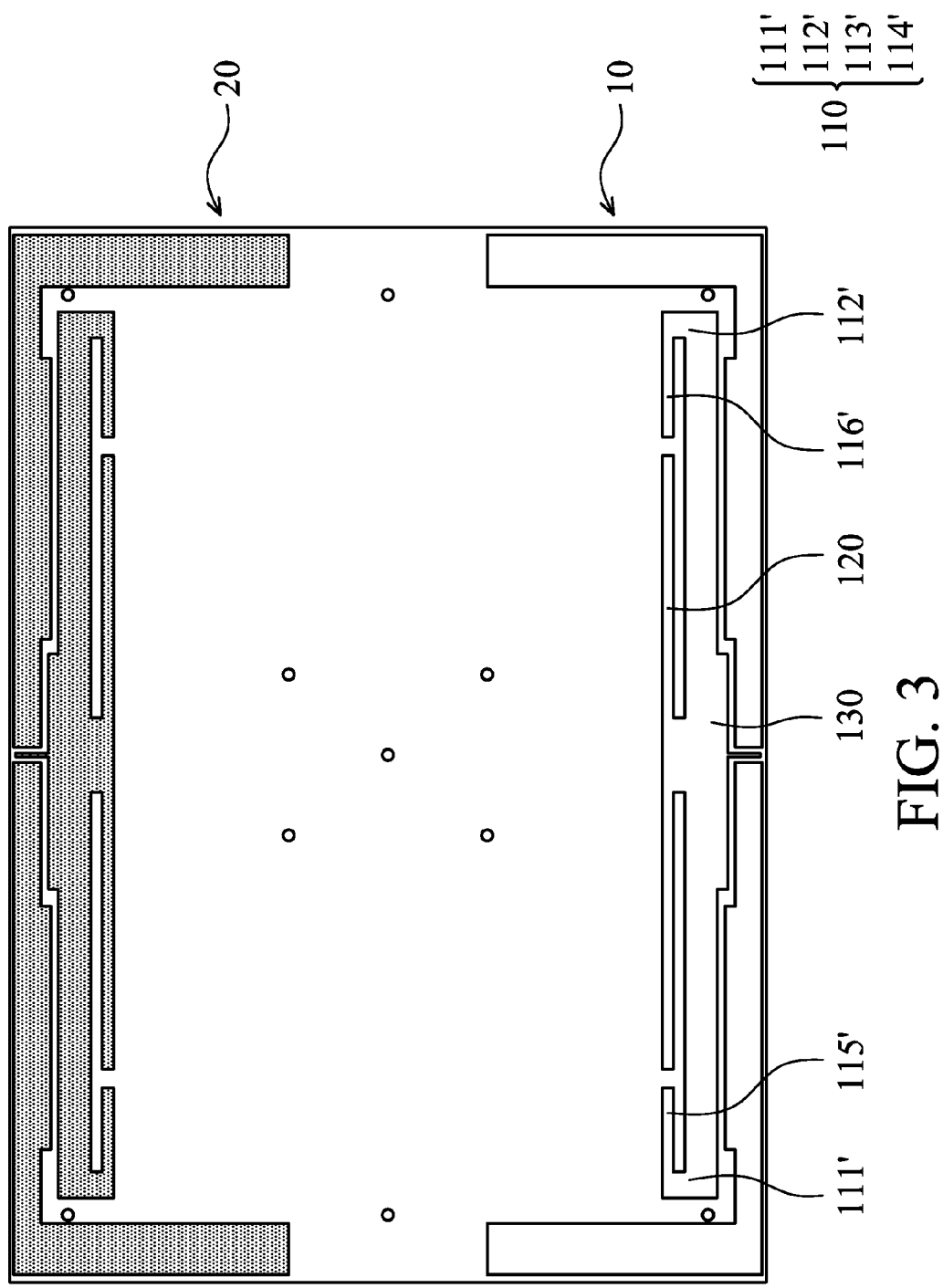
FIG. 3 shows the antenna testing device of the third embodiment of the invention.

In the embodiment above, the first wing shaped portion 111 and the second wing shaped portion 112 are trapezoidal, and the first bending portion 115 and the second bending portion 116 are L-shaped. However, the invention is not limited thereto. The shape of the elements of the embodiments of the invention can be modified. FIG. 3 shows an antenna testing device 3 of a third embodiment of the invention, wherein the first wing shaped portion 111' and the second wing shaped portion 112' can be L-shaped or rectangular, and the first bending portion 115' and the second bending portion 116' are rectangular.

Figure 4:
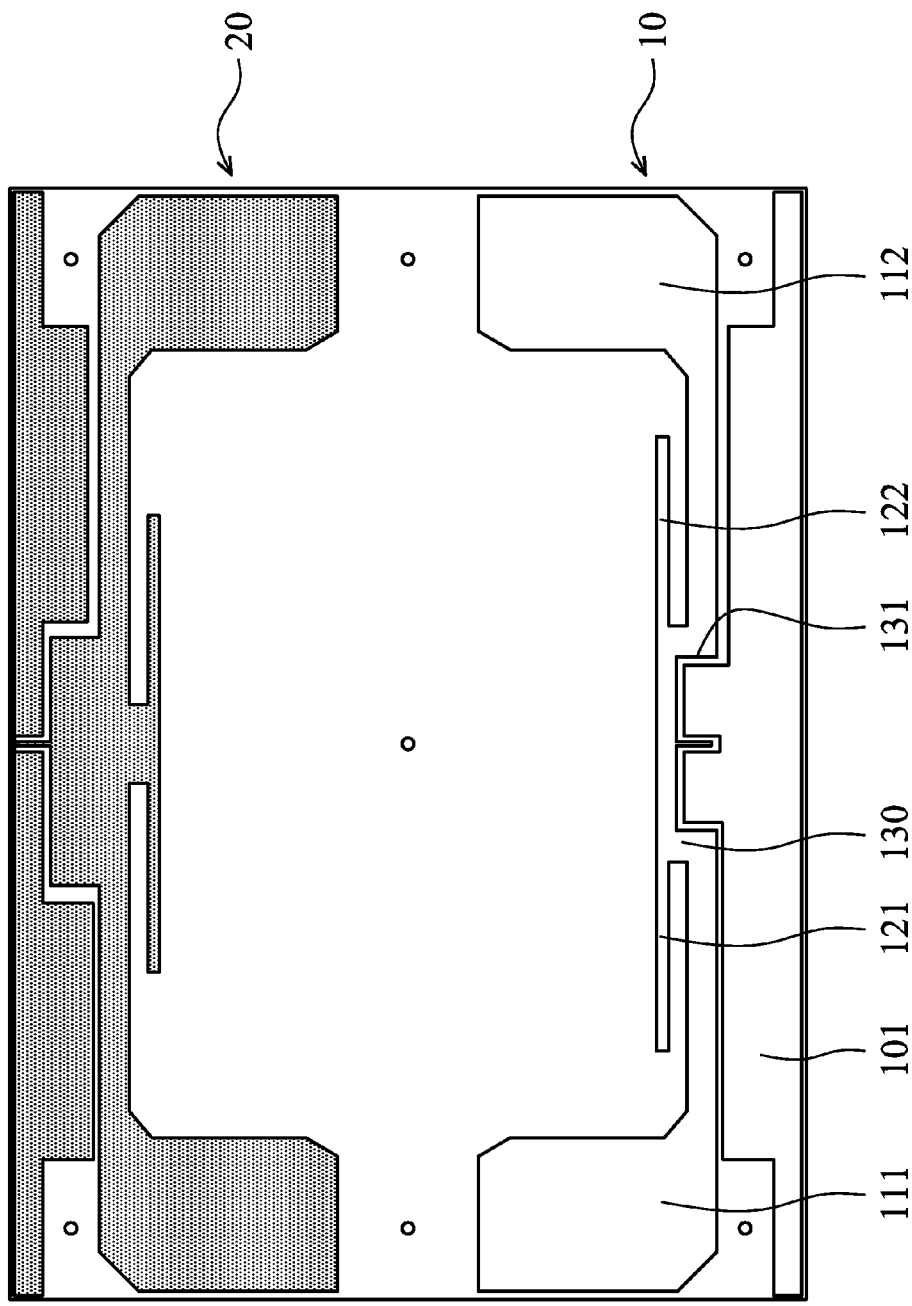
FIG. 4 shows the antenna testing device of the fourth embodiment of the invention.

FIG. 4 shows an antenna testing device 4 of a fourth embodiment of the invention. In this embodiment, the first wing shaped portion 111 and the second wing shaped portion 112 are directly connected to the body 130, and the first section 121 and the second section 122 are directly connected to the body 130. A body notch 131 can be formed on the body 130, and the ground element 101 is partially extended into the body notch 131.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An antenna testing unit, comprising:
   a ground element; and
   a radiator, comprising:
      a body;
      a first radiator unit, connected to the body, comprising a first wing shaped portion and a second wing shaped portion, wherein a shape of the first wing shaped portion is symmetrical to a shape of the second wing shaped portion, wherein the first radiator unit is a conductive solid structure; and
      a second radiator unit, connected to the body, comprising a first section and a second section, wherein the first section extends toward the first wing shaped portion, and the second section extends toward the second wing shaped portion, wherein the second radiator unit is a conductive solid structure, and at least a portion of the first radiator unit is located between the second radiator unit and the ground element.

2. The antenna testing unit as claimed in claim 1, wherein the second radiator unit further comprises a connection section connected to the body, and the first section, the second section, and the connection section compose a T-shaped structure.

3. The antenna testing unit as claimed in claim 2, wherein the T-shaped structure is on a central line, and the first wing portion is symmetrical to the second wing portion relative to the central line.

4. The antenna testing unit as claimed in claim 3, wherein the second radiator further comprises a first extending section and a second extending section, and the first extending section is connected to and perpendicular to the first section, and the second extending section is connected to and perpendicular to the second section.

5. The antenna testing unit as claimed in claim 3, wherein the first radiator unit further comprises a first extending portion and a second extending portion, and the first extending portion is connected to the first wing shaped portion and the body, and the second extending portion is connected to the second wing shaped portion and the body.

6. The antenna testing unit as claimed in claim 5, wherein the first section is parallel to the first extending portion, and the second section is parallel to the second extending portion.

7. The antenna testing unit as claimed in claim 6, wherein a coupling gap is formed between the first section and the first extending portion.

8. The antenna testing unit as claimed in claim 6, wherein the first extending portion comprises a first extending end, and the first wing shaped portion is connected to the first extending end, and a first bending edge is formed on a location where the first extending end is connected to the first wing shaped portion, and the second extending portion comprises a second extending end, and the second wing shaped portion is connected to the second extending end, and a second bending edge is formed on a location where the second extending end is connected to the second wing shaped portion.

9. The antenna testing unit as claimed in claim 6, wherein a coupling distance is formed between the first section and the ground element.

10. The antenna testing unit as claimed in claim 1, wherein the first radiator unit comprises a first bending portion and a second bending portion, and the first bending portion is connected to the first wing shaped portion, and the second bending portion is connected to the second wing shaped portion.

* * * * *